(12) United States Patent
Lee et al.

(10) Patent No.: US 12,150,345 B2
(45) Date of Patent: Nov. 19, 2024

(54) THIN FILM TRANSISTOR ARRAY SUBSTRATE AND ORGANIC LIGHT-EMITTING DIODE DISPLAY

(71) Applicant: Samsung Display Co., Ltd., Yongin-si (KR)

(72) Inventors: Won-Se Lee, Yongin-si (KR); Won-Kyu Kwak, Yongin-si (KR); Se-Ho Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/057,139

(22) Filed: Nov. 18, 2022

(65) Prior Publication Data
US 2023/0078000 A1 Mar. 16, 2023

Related U.S. Application Data

(60) Continuation of application No. 16/883,367, filed on May 26, 2020, now Pat. No. 11,605,688, which is a (Continued)

(30) Foreign Application Priority Data

Sep. 19, 2012 (KR) .................. 10-2012-0104215

(51) Int. Cl.
H01L 27/12 (2006.01)
H10K 50/00 (2023.01)
(Continued)

(52) U.S. Cl.
CPC ..... *H10K 59/1216* (2023.02); *H01L 27/1255* (2013.01); *H10K 50/00* (2023.02);
(Continued)

(58) Field of Classification Search
CPC ............................ H01L 27/1222; G09G 3/20
See application file for complete search history.

(56) References Cited

U.S. PATENT DOCUMENTS 5,291,438 A 3/1994 Witek et al.
6,664,569 B2 12/2003 Moon
(Continued)

FOREIGN PATENT DOCUMENTS

JP 2003-015548 A 1/2003
JP 2007-233271 A 9/2007
(Continued)

*Primary Examiner* — Mark V Prenty
(74) *Attorney, Agent, or Firm* — Lewis Roca Rothgerber Christie LLP

(57) ABSTRACT

A thin film transistor (TFT) array substrate includes: a substrate; a first insulation layer on the substrate; a capacitor including a lower electrode on the first insulation layer, and an upper electrode arranged to overlap with the whole lower electrode and having an opening, and the upper electrode is insulated from the lower electrode by a second insulation layer; an inter-layer insulation film covering the capacitor; a node contact hole in the inter-layer insulation film and the second insulation layer, and within the opening; and a connection node on the inter-layer insulation film and electrically coupling the lower electrode and at least one TFT to each other through the node contact hole.

44 Claims, 7 Drawing Sheets

Related U.S. Application Data division of application No. 15/707,884, filed on Sep. 18, 2017, now Pat. No. 10,720,483, which is a continuation of application No. 15/064,526, filed on Mar. 8, 2016, now Pat. No. 9,768,241, which is a continuation of application No. 13/801,937, filed on Mar. 13, 2013, now Pat. No. 9,299,730.

(51) Int. Cl.
    *H10K 59/121*     (2023.01)
    *H10K 59/131*     (2023.01)
    *H01L 49/02*     (2006.01)

(52) U.S. Cl.
    CPC ....... *H10K 59/1213* (2023.02); *H10K 59/131* (2023.02); *H01L 28/40* (2013.01)

(56) References Cited

U.S. PATENT DOCUMENTS

| | | | |
|---|---|---|---|
| 6,723,576 | B2 | 4/2004 | Nozawa et al. |
| 7,038,239 | B2 | 5/2006 | Murakami et al. |
| 7,064,482 | B2 | 6/2006 | Park |
| 7,227,184 | B2 | 6/2007 | Park et al. |
| 7,304,427 | B2 | 12/2007 | Park et al. |
| 7,408,597 | B2 | 8/2008 | Lee et al. |
| 7,576,354 | B2 | 8/2009 | Son et al. |
| 7,858,974 | B2 | 12/2010 | Yoon et al. |
| 7,864,140 | B2 | 1/2011 | Kim et al. |
| 9,299,730 | B2 | 3/2016 | Lee et al. |
| 9,570,534 | B2 | 2/2017 | Cho et al. |
| 9,768,241 | B2 | 9/2017 | Lee et al. |
| 10,720,483 | B2 | 7/2020 | Lee et al. |
| 11,605,688 | B2 * | 3/2023 | Lee .................. H10K 59/1213 |
| 2006/0132055 | A1 | 6/2006 | Kwak |
| 2008/0079005 | A1 | 4/2008 | Tseng |
| 2010/0182223 | A1 | 7/2010 | Choi et al. |
| 2011/0025585 | A1 | 2/2011 | Kim et al. |
| 2011/0025659 | A1 | 2/2011 | Kwak et al. |
| 2012/0105388 | A1 | 5/2012 | Han et al. |
| 2012/0146004 | A1 | 6/2012 | Lee et al. |
| 2012/0313100 | A1 | 12/2012 | Liu et al. |
| 2013/0063330 | A1 | 3/2013 | Eom |
| 2014/0077176 | A1 | 3/2014 | Lee et al. |

FOREIGN PATENT DOCUMENTS

| | | | |
|---|---|---|---|
| JP | 2010-072654 | A | 4/2010 |
| JP | 2012-043800 | A | 3/2012 |
| KR | 10-2001-0111328 | A | 12/2001 |
| KR | 10-2002-0043324 | A | 6/2002 |
| KR | 10-2003-0058150 | A | 7/2003 |
| KR | 10-2004-0046173 | A | 6/2004 |
| KR | 10-2004-0062105 | A | 7/2004 |
| KR | 10-2005-0061706 | A | 6/2005 |
| KR | 10-2005-0065820 | A | 6/2005 |
| KR | 10-2005-0090666 | A | 9/2005 |
| KR | 10-2006-0060461 | A | 6/2006 |
| KR | 10-2006-0060462 | A | 6/2006 |
| KR | 10-2007-0065551 | A | 6/2007 |
| KR | 10-2008-0001106 | A | 1/2008 |
| KR | 10-2008-0046454 | A | 5/2008 |
| KR | 10-2008-0048234 | A | 6/2008 |
| KR | 10-2008-0050704 | A | 6/2008 |
| KR | 10-2008-0085411 | A | 9/2008 |
| KR | 10-2010-0086256 | A | 7/2010 |
| KR | 10-2011-0011942 | A | 2/2011 |
| KR | 10-2011-0012710 | A | 2/2011 |
| KR | 10-2011-0113040 | A | 10/2011 |
| KR | 10-2012-0002141 | A | 1/2012 |
| KR | 10-1107682 | B1 | 1/2012 |
| KR | 10-2012-0044657 | A | 5/2012 |
| KR | 10-2012-0066491 | A | 6/2012 |
| KR | 10-2019-0119561 | A | 10/2019 |

\* cited by examiner

THIN FILM TRANSISTOR ARRAY SUBSTRATE AND ORGANIC LIGHT-EMITTING DIODE DISPLAY

CROSS-REFERENCE TO RELATED APPLICATION

This application is a continuation of U.S. application Ser. No. 16/883,367, filed May 26, 2020, which is a divisional of U.S. application Ser. No. 15/707,884, filed Sep. 18, 2017, now U.S. Pat. No. 10,720,483, which is a continuation of U.S. application Ser. No. 15/064,526, filed Mar. 8, 2016, now U.S. Pat. No. 9,768,241, which is a continuation of U.S. application Ser. No. 13/801,937, filed Mar. 13, 2013, now U.S. Pat. No. 9,299,730, which claims priority to and the benefit of Korean Patent Application No. 10-2012-0104215, filed on Sep. 19, 2012, in the Korean Intellectual Property Office, the entire contents of all of which are incorporated herein by reference.

BACKGROUND

1. Field

Embodiments of the present invention relate to a thin film transistor (TFT) array substrate including at least one TFT and one storage capacitor, and an organic light-emitting diode (OLED) display.

2. Description of Related Art

An organic light-emitting diode (OLED) display may include two electrodes and an organic light-emitting layer interposed therebetween, wherein electrons injected from one electrode and holes injected from the other electrode are combined to form excitons that release energy, thereby emitting light.

Such an OLED display may also include a plurality of pixels, each pixel including an OLED, which is a self light-emitting device, a plurality of thin film transistors (TFTs), and a capacitor for driving the OLED.

The capacitor may include lower and upper electrodes and a dielectric interposed therebetween. Each electrode may be patterned through a photolithography process after a conductive layer is formed on the whole surface of a substrate. In a system in which a great number of large-sized panels are manufactured at the same time, a misalignment may occur between a substrate and a mask or a light exposure device within a tolerance (or tolerance level) of process equipment during a patterning process. Contrary to an intention of the design, an overlay deviation may occur between both of the electrodes of the capacitor due to the misalignment. Due to the overlay deviation, a capacitance may be generated that is different from a designed value, thereby resulting in low-gradation spots, abnormal colors, or the like.

SUMMARY

Aspects of embodiments of the present invention provide a thin film transistor (TFT) array substrate including a storage capacitor structure for maintaining a capacitance to be substantially constant even though an overlay deviation occurs, and an organic light-emitting diode (OLED) display employing the same.

According to an aspect of the present invention, a TFT array substrate includes: a substrate; a first insulation layer on the substrate; a capacitor including a lower electrode on the first insulation layer, and an upper electrode arranged to overlap with the whole lower electrode and having an opening, and the upper electrode is insulated from the lower electrode by a second insulation layer; an inter-layer insulation film covering the capacitor; a node contact hole in the inter-layer insulation film and the second insulation layer, and within the opening; and a connection node on the inter-layer insulation film and electrically coupling the lower electrode and at least one TFT to each other through the node contact hole.

The opening may overlap with the lower electrode.

The upper electrode may be configured to receive a driving voltage through a driving voltage line formed from the same layer as the connection node.

The driving voltage line may be coupled to the upper electrode through another contact hole in the inter-layer insulation film.

The TFT array substrate may further include a driving TFT arranged to overlap with the capacitor. A driving gate electrode of the driving TFT may include the lower electrode.

The at least one TFT may include a compensation TFT coupled to the driving TFT and electrically coupled to the lower electrode through the connection node, and the compensation TFT may be configured to compensate for a threshold voltage of the driving TFT.

A compensation gate electrode of the compensation TFT may be formed from the same layer as the lower electrode.

The at least one TFT may include an initialization TFT electrically coupled to the lower electrode through the connection node, and the initialization TFT may be configured to provide an initialization voltage to the driving gate electrode of the driving TFT by being turned on in response to a previous scan signal.

An initialization gate electrode of the initialization TFT may be formed from the same layer as the lower electrode.

According to another aspect of the present invention, an OLED display includes: a substrate; a first insulation layer on the substrate; a scan line on the first insulation layer and configured to deliver a scan signal; a data line and a driving voltage line crossing the scan line, the data line and the driving voltage line being insulated by a second insulation layer and an inter-layer insulation film and configured to respectively deliver a data signal and a driving voltage; a pixel circuit coupled to the scan line and the data line and including at least one thin film transistor (TFT) and a capacitor; an OLED for emitting light by receiving the driving voltage from the pixel circuit, and the capacitor includes a lower electrode on the first insulation layer, and an upper electrode arranged to overlap with the whole lower electrode and having an opening, and the upper electrode is insulated from the lower electrode by the second insulation layer; a node contact hole in the inter-layer insulation film and the second insulation layer, and within the opening; and a connection node on the inter-layer insulation film and electrically coupling the lower electrode and the at least one TFT to each other through the node contact hole.

The opening may overlap with the lower electrode.

The upper electrode may be configured to receive a driving voltage through a driving voltage line formed from the same layer as the connection node.

The driving voltage line may be coupled to the upper electrode through another contact hole in the inter-layer insulation film.

The OLED display may further include a driving TFT arranged to overlap with the capacitor. A driving gate electrode of the driving TFT may include the lower electrode.

The at least one TFT may include a compensation TFT coupled to the driving TFT and electrically coupled to the lower electrode through the connection node, and the compensation TFT may be configured to compensate for a threshold voltage of the driving TFT.

A compensation gate electrode of the compensation TFT may be formed from the same layer as the lower electrode.

The at least one TFT may include an initialization TFT electrically coupled to the lower electrode through the connection node, and the initialization TFT may be configured to provide an initialization voltage to the driving gate electrode of the driving TFT by being turned on in response to a previous scan signal.

An initialization gate electrode of the initialization TFT may be formed from the same layer as the lower electrode.

The OLED display may further include a switching TFT for delivering the data signal to the driving TFT by being turned on by the scan signal.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
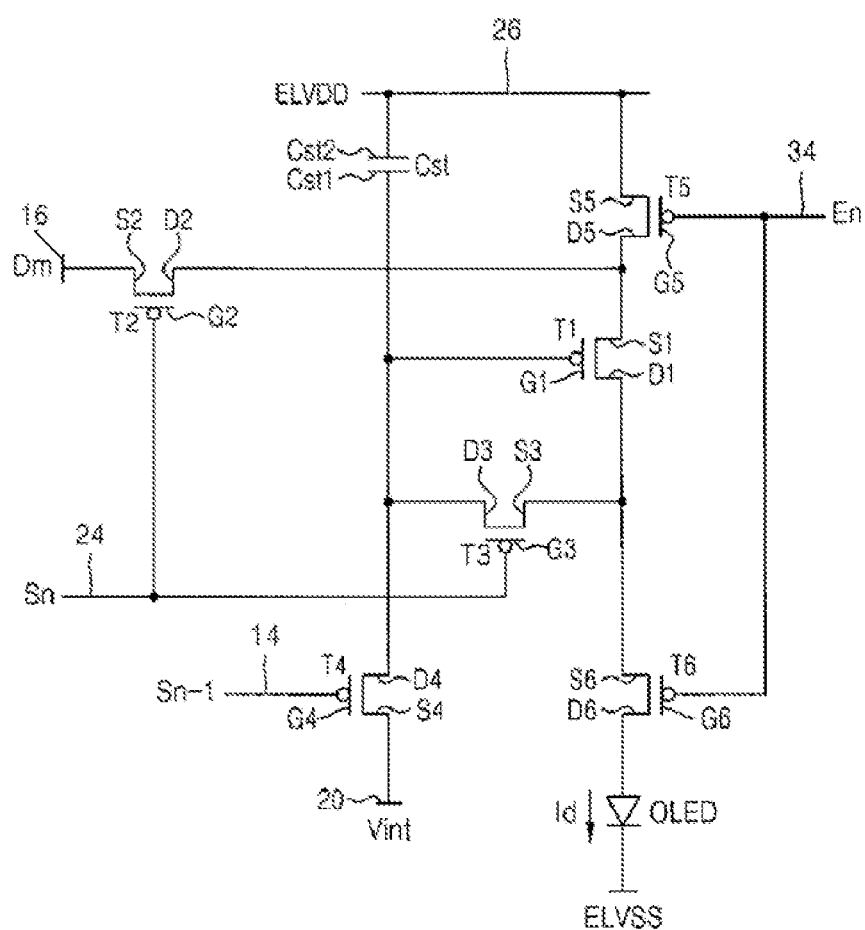
FIG. 1 is an equivalent circuit diagram of one pixel in an organic light-emitting diode (OLED) display according to an embodiment of the present invention.

Embodiments of the present invention will be described in detail with reference to the attached drawings, so that one of ordinary skill in the art may implement the spirit and scope of the present invention. The present invention can be implemented in various different forms and is not limited to the embodiments described below.

Parts irrelevant to the description may have been omitted to more clearly describe the present invention, and like reference numerals denote like elements throughout the specification.

In addition, since the sizes and thicknesses of components in the drawings are arbitrarily shown for convenience of description, the present invention is not necessarily limited to the shown sizes and thicknesses.

In the drawings, the thicknesses of layers and regions are magnified for clarity. In addition, the thicknesses of some layers and regions are exaggerated for convenience of description. When it is described that a certain component, such as a layer, a film, a region, or a plate, is "above" or "on" another component, the certain component may be directly above another component, or a third component may be interposed therebetween.

In the specification, when a certain part "includes" a certain component, this indicates that the part may further include another component instead of excluding another component unless there is no different disclosure. In addition, the term "on" indicates that a certain part is located above or below another part and does not necessarily indicate that the certain part is located above another part based on a direction of gravity.

As used herein, expressions such as "at least one of," when preceding a list of elements, modify the entire list of elements and do not modify the individual elements of the list.

An organic light-emitting diode (OLED) display according to an embodiment will now be described in detail with reference to FIGS. 1 to 5.

FIG. 1 is an equivalent circuit diagram of one pixel in an OLED display according to an embodiment of the present invention.

As shown in FIG. 1, the pixel in the OLED display includes a plurality of lines (or signal lines) 14, 24, 34, 16, 26, and 20 and a pixel circuit, which includes a plurality of thin film transistors (TFTs) T1, T2, T3, T4, T5, and T6 that are coupled to the plurality of signal lines 14, 24, 34, 16, 26, and 20 and a storage capacitor Cst. In addition, the pixel further includes an OLED for emitting light by receiving a driving voltage from the pixel circuit.

The plurality of TFTs T1, T2, T3, T4, T5, and T6 includes a driving TFT T1, a switching TFT T2, a compensation TFT T3, an initialization TFT T4, an operation control TFT T5, and a light-emitting control TFT T6.

The plurality of lines 14, 24, 34, 16, 26, and 20 includes a scan line 24 for delivering a scan signal Sn, a previous scan line 14 for delivering a previous scan signal Sn−1, a light-emitting control line 34 for delivering a light-emitting control signal En to the operation control TFT T5 and the light-emitting control TFT T6, a data line 16, which crosses the scan line 24 and delivers a data signal Dm, a driving voltage line 26, which delivers a driving voltage ELVDD and is formed to be almost parallel to the data line 16, and an initialization voltage line 20 for delivering an initialization voltage Vint for initializing the driving TFT T1.

A gate electrode G1 of the driving TFT T1 is coupled to one electrode Cst1 of the storage capacitor Cst, a source electrode S1 thereof is coupled to the driving voltage line 26 via the operation control TFT T5, and a drain electrode D1 thereof is electrically coupled to an anode of the OLED via the light-emitting control TFT T6. In response to a switching operation of the switching TFT T2, the driving TFT T1 receives the data signal Dm and provides a driving current Id to the OLED.

A gate electrode G2 of the switching TFT T2 is coupled to the scan line 24, a source electrode S2 thereof is coupled to the data line 16, and a drain electrode D2 thereof is coupled to the source electrode S1 of the driving TFT T1 and is also coupled to the driving voltage line 26 via the operation control TFT T5. The switching TFT T2 performs a switching operation for delivering the data signal Dm received through the data line 16 to the source electrode S1 of the driving TFT T1 by being turned on in response to the scan signal Sn received through the scan line 24.

A gate electrode G3 of the compensation TFT T3 is coupled to the scan line 24, a source electrode S3 thereof is coupled to the drain electrode D1 of the driving TFT T1 and is also coupled to the anode of the OLED via the light-emitting control TFT T6, and a drain electrode D3 thereof is coupled to the one electrode Cst1 of the storage capacitor Cst, a drain electrode D4 of the initialization TFT T4, and the gate electrode G1 of the driving TFT T1. The compensation TFT T3 couples the gate electrode G1 and the drain electrode D1 of the driving TFT T1 to each other by being turned on in response to the scan signal Sn received through the scan line 24 so that the driving TFT T1 is diode-coupled.

A gate electrode G4 of the initialization TFT T4 is coupled to the previous scan line 14, a source electrode S4 thereof is coupled to the initialization voltage line 20, and the drain electrode D4 thereof is coupled to the one electrode Cst1 of the storage capacitor Cst, the drain electrode D3 of the compensation TFT T3, and the gate electrode G1 of the driving TFT T1. The initialization TFT T4 delivers the initialization voltage Vint to the gate electrode G1 of the driving TFT T1 by being turned on in response to the previous scan signal Sn−1 received through the previous scan line 14 to perform an initialization operation for initializing a voltage of the gate electrode G1 of the driving TFT T1.

A gate electrode G5 of the operation control TFT T5 is coupled to the light-emitting control line 34, a source electrode S5 thereof is coupled to the driving voltage line 26, and a drain electrode D5 thereof is coupled to the source electrode S1 of the driving TFT T1 and the drain electrode D2 of the switching TFT T2.

A gate electrode G6 of the light-emitting control TFT T6 is coupled to light-emitting control line 34, a source electrode S6 thereof is coupled to the drain electrode D1 of the driving TFT T1 and the source electrode S3 of the compensation TFT T3, and a drain electrode D6 thereof is electrically coupled to the anode of the OLED. The operation control TFT T5 and the light-emitting control TFT T6 are concurrently (e.g., simultaneously) turned on in response to the light-emitting control signal En received through the light-emitting control line 34 to deliver the driving voltage ELVDD to the OLED so that the driving current Id flows through the OLED.

The other electrode Cst 2 of the storage capacitor Cst is coupled to the driving voltage line 26. The one electrode Cst1 of the storage capacitor Cst is coupled to the gate electrode G1 of the driving TFT T1, the drain electrode D3 of the compensation TFT T3, and the drain electrode D4 of the initialization TFT T4 via a connection node.

A cathode of the OLED is coupled to a common voltage ELVSS. Accordingly, the OLED emits light by receiving the driving current Id from the driving TFT T1 so that an image is displayed.

An operation of the pixel in the OLED display of FIG. 1 will now be described in detail.

During an initialization period, the previous scan signal Sn−1 at a low level is provided through the previous scan line 14. In response to the previous scan signal Sn−1 at a low level, the initialization TFT T4 is turned on, thereby providing the initialization voltage Vint to the gate electrode G1 of the driving TFT T1 via the initialization TFT T4 through the initialization voltage line 20. The driving TFT T1 is initialized by the initialization voltage Vint.

During a data programming period, the scan signal Sn at a low level is supplied through the scan line 24. In response to the scan signal Sn, the switching TFT T2 and the compensation TFT T3 are turned on.

Due to the turn-on state of the compensation TFT T3, the driving TFT T1 is diode-coupled and biased in a forward direction.

In this case, a compensation voltage Dm+Vth (Vth has a negative value) obtained by subtracting a threshold voltage Vth of the driving TFT T1 from the data signal Dm input through the data line 16 is applied to the gate electrode G1 of the driving TFT T1.

Then, the driving voltage ELVDD and the compensation voltage Dm+Vth are applied to both of the electrodes of the storage capacitor Cst, thereby storing charges corresponding to a voltage difference between both of the electrodes of the storage capacitor Cst in the storage capacitor Cst. During a light-emitting period, the light-emitting control signal En provided through the light-emitting control line 34 is changed from a high level to a low level, thereby turning on the operation control TFT T5 and the light-emitting control TFT T6.

Then, the driving current Id is generated due to a voltage difference between a voltage at the gate electrode G1 of the driving TFT T1 and the driving voltage ELVDD and is supplied to the OLED through the light-emitting control TFT T6. During the light-emitting period, a gate-source voltage Vgs of the driving TFT T1 is maintained as '(Dm+Vth)−ELVDD' by the storage capacitor Cst, and according to a current-voltage relationship of the driving TFT T1, the driving current Id is determined regardless of the threshold voltage Vth of the driving TFT T1.

Figure 2:
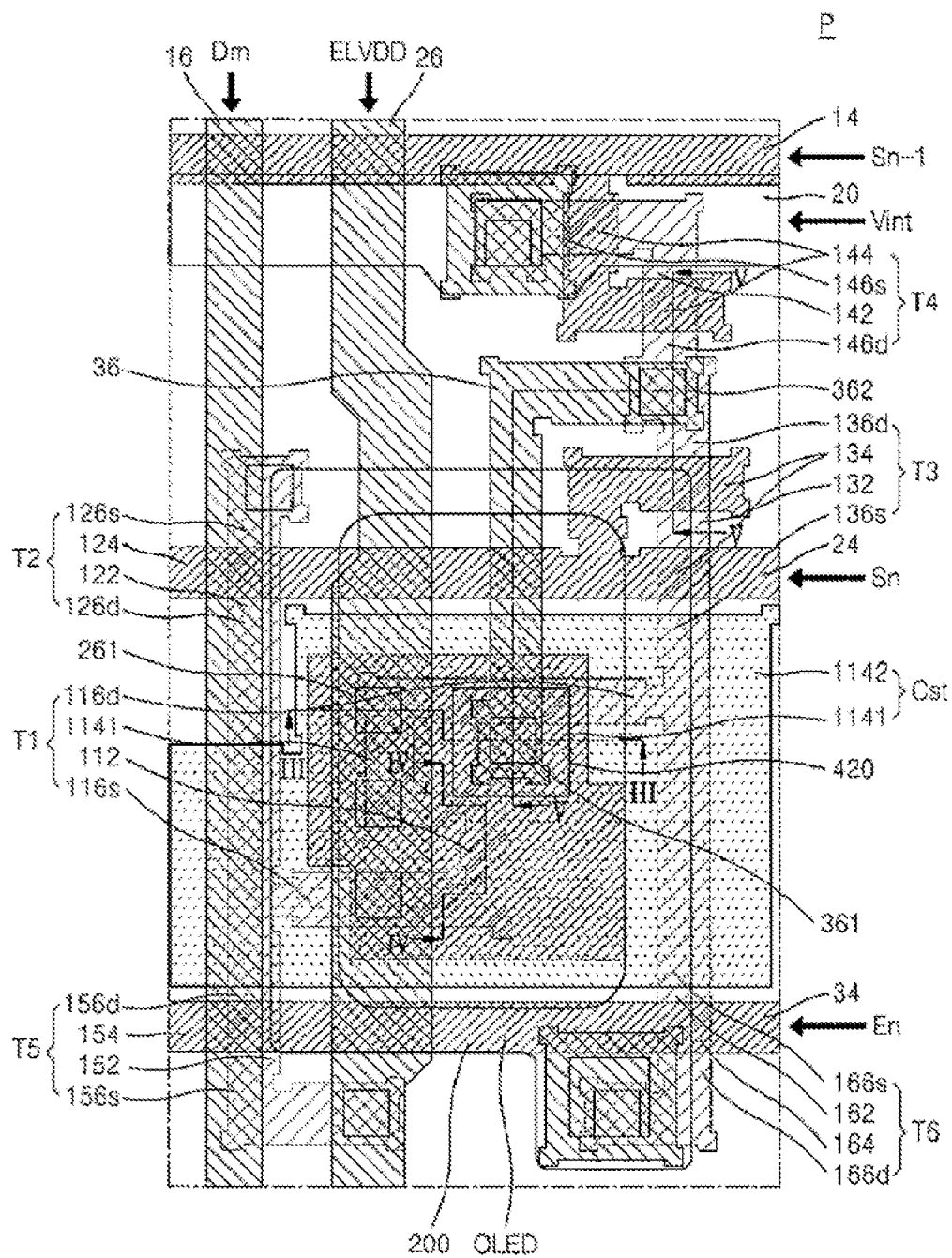
FIG. 2 is a top view of the pixel in the OLED display of FIG. 1.
Figure 3:
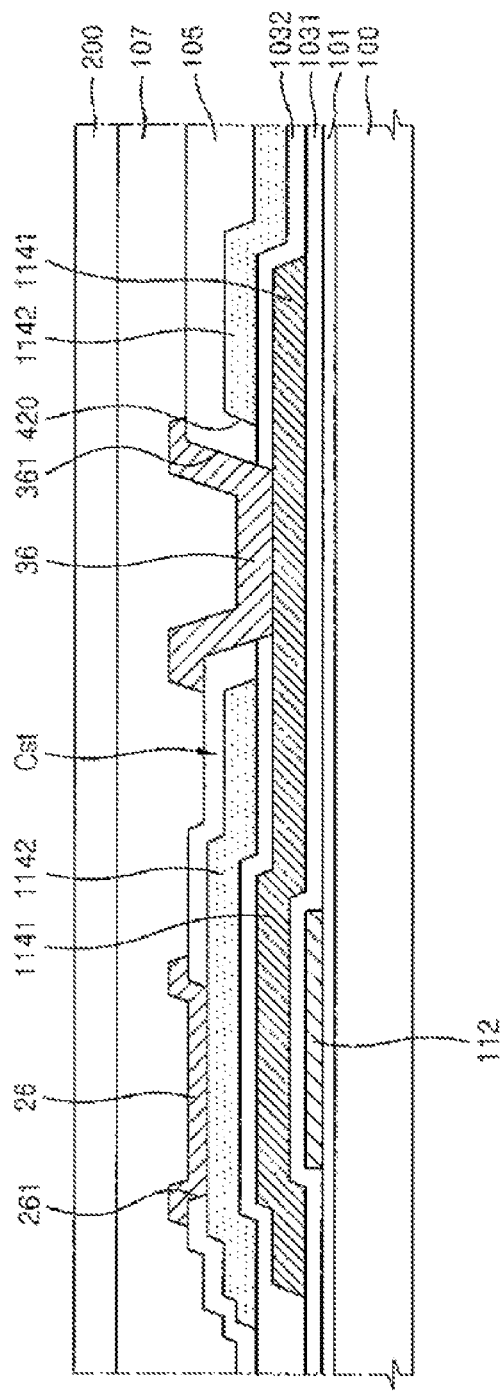
FIG. 3 is a cross-sectional view through line III-III of FIG. 2.
Figure 4:
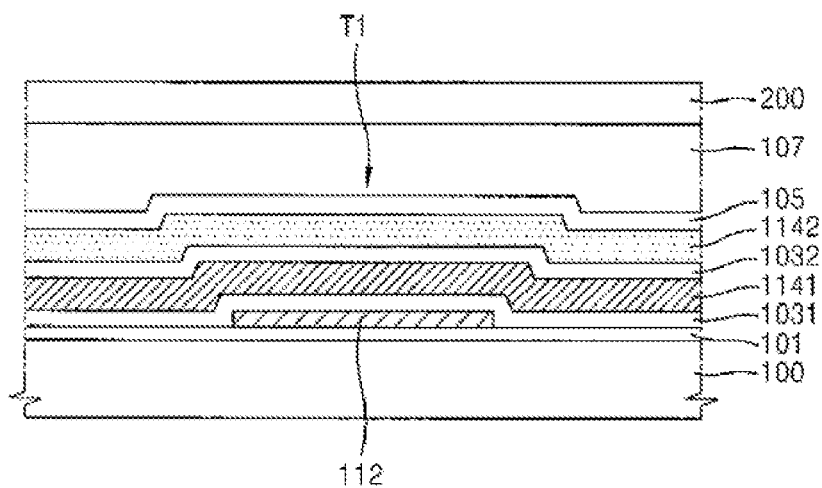
FIG. 4 is a cross-sectional view through line IV-IV of FIG. 2.
Figure 5:
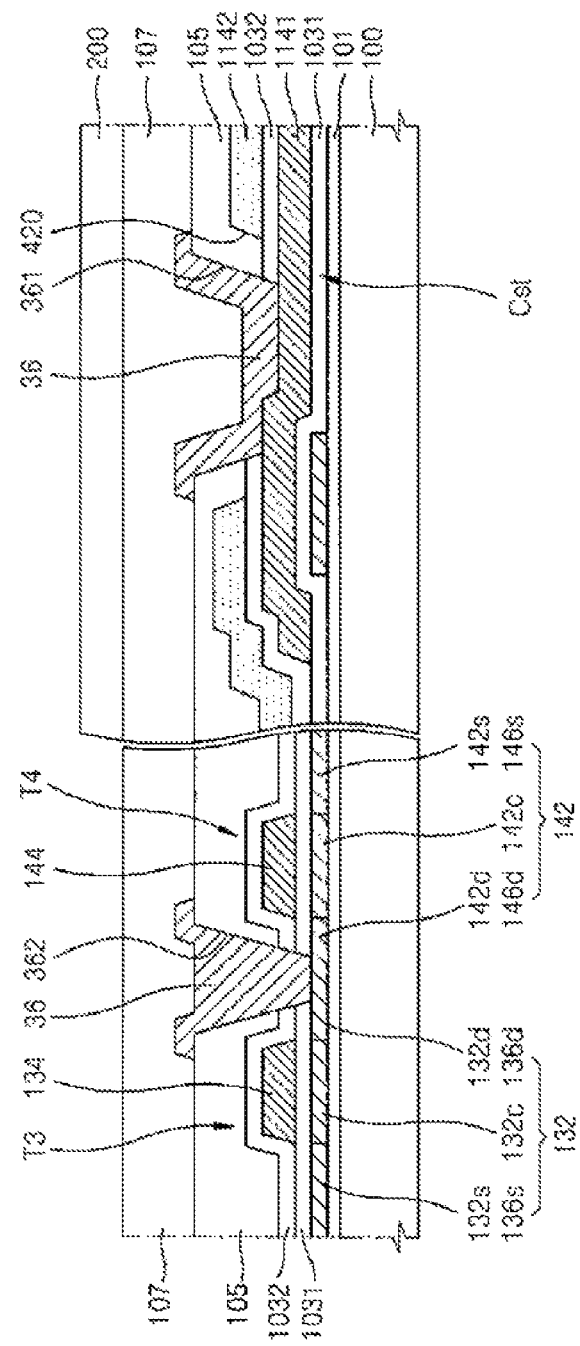
FIG. 5 is a cross-sectional view through line V-V of FIG. 2.

A structure of the pixel in the OLED display of FIG. 1 will now be described in detail with reference to FIGS. 2 to 5, which are based on FIG. 1. FIG. 2 is a top view of a pixel P in the OLED display of FIG. 1. FIG. 3 is a cross-sectional view through the line III-III of FIG. 2. FIG. 4 is a cross-sectional view through the line IV-IV of FIG. 2. FIG. 5 is a cross-sectional view through the line V-V of FIG. 2.

As shown in FIGS. 2 to 5, according to an embodiment, the pixel P in the OLED display includes the scan line 24, the previous scan line 14, the light-emitting control line 34, and the initialization voltage line 20, which apply the scan signal Sn, the previous scan signal Sn−1, the light-emitting control signal En, and the initialization voltage Vint, respectively, along a row direction, and includes the data line 16 and the driving voltage line 26, which cross each of the scan line 24, the previous scan line 14, the light-emitting control line 34, and the initialization voltage line 20, and apply the data signal Dm and the driving voltage ELVDD, respectively.

In addition, the pixel P includes the driving TFT T1, the switching TFT T2, the compensation TFT T3, the initialization TFT T4, the operation control TFT T5, the light-emitting control TFT T6, the storage capacitor Cst, and the OLED.

The driving TFT T1, the switching TFT T2, the compensation TFT T3, the initialization TFT T4, the operation control TFT T5, and the light-emitting control TFT T6 are formed along semiconductor layers 112, 122, 132, 142, 152, and 162, which are formed bent in various shapes, respectively. Each of the semiconductor layers 112, 122, 132, 142, 152, and 162 is formed of polysilicon. Each of the semiconductor layers 112, 122, 132, 142, 152, and 162 includes a channel region not doped with impurities, and a source region and a drain region, doped with impurities, formed at both sides of the channel region. The impurities vary according to types of the TFTs and may include N-type impurities and/or P-type impurities.

The semiconductor layers 112, 122, 132, 142, 152, and 162 include a driving semiconductor layer 112 formed in the driving TFT T1, a switching semiconductor layer 122 formed in the switching TFT T2, a compensation semiconductor layer 132 formed in the compensation TFT T3, an initialization semiconductor layer 142 formed in the initialization TFT T4, an operation control semiconductor layer 152 formed in the operation control TFT T5, and a light-emitting control semiconductor layer 162 formed in the light-emitting control TFT T6.

The driving TFT T1 includes the driving semiconductor layer 112, a driving gate electrode 114१, a driving source electrode 116s, and a driving drain electrode 116d. The driving semiconductor layer 112 is bent. The driving source electrode 116s corresponds to a driving source region 116s doped with impurities in the driving semiconductor layer 112, and the driving drain electrode 116d corresponds to a driving drain region 116d doped with impurities in the driving semiconductor layer 112. The storage capacitor Cst is formed on the driving TFT T1 to overlap with the driving TFT T1.

The storage capacitor Cst includes lower and upper electrodes 1141 and 1142 with a second gate insulation film 1032 interposed therebetween. The driving gate electrode 1141 also functions as the lower electrode 1141. That is, the driving gate electrode 1141 includes the lower electrode 1141. The second gate insulation film 1032 is formed of a dielectric, and a storage capacitance is determined by charges accumulated in the storage capacitor Cst and a voltage between the lower and upper electrodes 1141 and 1142.

According to an embodiment, the lower electrode 1141 is formed as a floating electrode having an island shape and is formed of the same material layers as the scan line 24, the previous scan line 14, the light-emitting control line 34, a switching gate electrode 124, a compensation gate electrode 134, an initialization gate electrode 144, an operation control gate electrode 154, and a light-emitting control gate electrode 164.

The upper electrode 1142 may be formed on the second gate insulation film 1032 as a floating electrode having an island shape. In one embodiment, the upper electrode 1142 is arranged to overlap with the whole lower electrode 1141 and has a storage opening 420. The storage opening 420 may have a shape of a simple closed curve penetrating the upper electrode 1142. According to one embodiment, the simple closed curve refers to a closed figure in which a start point and an end point are the same when the closed curve is traced from the start point of the traced curve to draw a polygon, a circle, or the like. The upper electrode 1142 having the storage opening 420 may have a doughnut shape.

According to an embodiment of the present invention, by using the storage capacitor Cst including the upper electrode 1142, which overlaps with the whole lower electrode 1141 and has the storage opening 420 having a simple closed curve, even though an overlay deviation occurs between the lower electrode 1141 and the upper electrode 1142 during a method of manufacturing the OLED display, the capacitance of the storage capacitor Cst may be maintained (e.g., always be maintained) to be substantially constant. This feature will be described in detail below with reference to FIGS. 6 and 7.

The switching TFT T2 includes the switching semiconductor layer 122, the switching gate electrode 124, a switching source electrode 126s, and a switching drain electrode 126d. The switching source electrode 126s protrudes from the data line 16, and the switching drain electrode 126d corresponds to a switching drain region 126d doped with impurities in the switching semiconductor layer 122.

The compensation TFT T3 includes the compensation semiconductor layer 132, the compensation gate electrode 134, a compensation source electrode 136s, and a compensation drain electrode 136d, wherein the compensation source electrode 136s corresponds to a compensation source region 136s doped with impurities in the compensation semiconductor layer 132, and the compensation drain electrode 136d corresponds to a compensation drain region 136d doped with impurities in the compensation semiconductor layer 132. The compensation drain electrode 136d may be coupled to the lower electrode 1141 via a connection node 36. In one embodiment, the compensation gate electrode 134 prevents a leakage current by forming a separate dual gate electrode.

The initialization TFT T4 includes the initialization semiconductor layer 142, the initialization gate electrode 144, an initialization source electrode 146s, and an initialization drain electrode 146d. The initialization drain electrode 146d corresponds to an initialization drain region 146d doped with impurities in the initialization semiconductor layer 142. The initialization drain electrode 146d may be coupled to the lower electrode 1141 via the connection node 36. The initialization source electrode 146s may be coupled to the initialization voltage line 20 via a connection member.

The operation control TFT T5 includes the operation control semiconductor layer 152, the operation control gate electrode 154, an operation control source electrode 156s, and an operation control drain electrode 156d. The operation control source electrode 156s is a portion of the driving voltage line 26, and the operation control drain electrode 156d corresponds to an operation control drain region 156d doped with impurities in the operation control semiconductor layer 152.

The light-emitting control TFT T6 includes the light-emitting control semiconductor layer 162, the light-emitting control gate electrode 164, a light-emitting control source electrode 166s, and a light-emitting control drain electrode 166d. The light-emitting control source electrode 166s corresponds to a light-emitting control source region 166s doped with impurities in the light-emitting control semiconductor layer 162, and the light-emitting control drain electrode 166d may be coupled to a pixel electrode 200 via a connection member.

According to one embodiment, one end of the driving semiconductor layer 112 of the driving TFT T1 is coupled to the switching semiconductor layer 122 and the operation control semiconductor layer 152, and the other end thereof is coupled to the compensation semiconductor layer 132 and the light-emitting control semiconductor layer 162. Thus, the driving source electrode 116s is coupled to the switching drain electrode 126d and the operation control drain electrode 156d, and the driving drain electrode 116d is coupled to the compensation source electrode 136s and the light-emitting control source electrode 166s.

The lower electrode 1141 of the storage capacitor Cst may be coupled to the compensation TFT T3 and the initialization TFT T4 via the connection node 36. The connection node 36 may be formed in the same layer as the data line 16. One end of the connection node 36 may be coupled to the lower electrode 1141 via a first node contact hole 361 formed in the second gate insulation film 1032 and an inter-layer insulation film 105. The first node contact hole 361 may be formed within the storage opening 420 of the upper electrode 1142. The other end of the connection node 36 may be coupled to the compensation drain electrode 136d and the initialization drain electrode 146d via a second node contact hole 362 formed in a first gate insulation film 1031, the second gate insulation film 1032, and the inter-layer insulation film 105.

The upper electrode 1142 of the storage capacitor Cst may be used as a switching device for selecting a pixel from which light is emitted. In one embodiment, the switching gate electrode 124 is coupled to the scan line 24, the switching source electrode 126s is coupled to the data line 16, and the switching drain electrode 126d is coupled to the driving TFT T1 and the operation control TFT T5.

The light-emitting control drain electrode 166d of the light-emitting control TFT T6 is directly coupled to the pixel electrode 200 of the OLED via a via hole (not shown) formed on a protection film 107.

A structure of an OLED display according to an embodiment of the present invention will now be described in detail in a layered order with reference to FIGS. 3 to 5. For convenience of description, FIGS. 3 to 5 show only layers from a substrate 100 to the pixel electrode 200. In FIGS. 3 to 5, a structure of the driving TFT T1, the compensation TFT T3, and the initialization TFT T4 is mainly described. The storage capacitor Cst is described together with them. Since the other TFTs T2, T5, and T6 substantially have a similar (or the same) structure as the driving TFT T1, the compensation TFT T3, and the initialization TFT T4, a detailed description thereof is omitted.

In one embodiment, a buffer layer 101 is formed on the substrate 100, which may be an insulation substrate formed of glass, quartz, ceramic, plastic, or the like.

The driving semiconductor layer 112, the compensation semiconductor layer 132, and the initialization semiconductor layer 142 are formed on the buffer layer 101. Although not shown, the driving semiconductor layer 112 may include a driving channel region, and a driving source region and a driving drain region facing each other with the driving channel region therebetween. The compensation semiconductor layer 132 also includes a compensation channel region 132c, and the compensation source region 136s and the compensation drain region 136d facing each other with the compensation channel region 132c therebetween. The initialization semiconductor layer 142 also includes an initialization channel region 142c, and an initialization source region 146s and the initialization drain region 146d facing each other with the initialization channel region 142c therebetween.

The first gate insulation film 1031 is formed on the driving semiconductor layer 112, the compensation semiconductor layer 132, and the initialization semiconductor layer 142. The first gate insulation film 1031 may be formed of silicon nitride ($SiN_x$), silicon oxide ($SiO_2$), or the like.

A first gate conductive layer, parts of which form the driving gate electrode 1141 including the lower electrode 1141 of the storage capacitor Cst, the scan line 24 including the compensation gate electrode 134, the previous scan line 14 including the initialization gate electrode 144, and the light-emitting control line 34 including the operation control gate electrode 154 and the light-emitting control gate electrode 164, is formed on the first gate insulation film 1031.

In one embodiment, the driving gate electrode 1141 or the lower electrode 1141 are separated from the previous scan line 14, the scan line 24, and the light-emitting control line 34 and overlap with the driving channel region of the driving semiconductor layer 112. The compensation gate electrode 134 is coupled to the scan line 24 and overlaps with the compensation channel region 132c of the compensation semiconductor layer 132. The initialization gate electrode 144 is coupled to the previous scan line 14 and overlaps with the initialization channel region 142c of the initialization semiconductor layer 142.

The second gate insulation film 1032 covers the first gate conductive layer and the first gate insulation film 1031. The second gate insulation film 1032 may be formed of $SiN_x$, $SiO_2$, or the like.

A second gate conductive layer 1142 including the upper electrode 1142 of the storage capacitor Cst is formed on the second gate insulation film 1032. The upper electrode 1142, which operates as a floating electrode, overlaps with the whole lower electrode 1141 to form the storage capacitor Cst and has the storage opening 420 overlapping with the lower electrode 1141. The storage opening 420 may have a shape of a simple closed curve penetrating the upper electrode 1142.

The inter-layer insulation film 105 is formed on the second gate insulation film 1032 and the upper electrode 1142. Like the first gate insulation film 1031 and the second gate insulation film 1032, the inter-layer insulation film 105 is formed of a ceramic series material, such as $SiN_x$, $SiO_2$, or the like.

The first node contact hole 361 is formed in the second gate insulation film 1032 and the inter-layer insulation film 105, within the storage opening 420 of the upper electrode 1142 to expose the lower electrode 1141 to the outside. In addition, the second node contact hole 362 is formed in the first gate insulation film 1031, the second gate insulation film 1032, and the inter-layer insulation film 105 to expose the compensation drain region 136d of the compensation semiconductor layer 132 and the initialization drain region 146d of the initialization semiconductor layer 142.

The driving voltage line 26, the connection node 36, and the data line 16 are formed on the inter-layer insulation film 105. The driving voltage line 26 is coupled to the upper electrode 1142 of the storage capacitor Cst through a driving voltage line contact hole 261 so that the upper electrode 1142 receives the driving voltage ELVDD through the driving voltage line 26. One end of the connection node 36 is coupled to the lower electrode 1141 of the storage capacitor Cst via the first node contact hole 361, and the other end of the connection node 36 is coupled to the compensation drain electrode 136d of the compensation TFT T3 and the initialization drain electrode 146d of the initialization TFT T4 via the second node contact hole 362. As described above, the compensation drain electrode 136d and the initialization drain electrode 146d correspond to the compensation drain region 136d and the initialization drain region 146d, respectively.

The protection film 107 covering the data line 16, the driving voltage line 26, and the connection node 36 is formed on the inter-layer insulation film 105, and the pixel electrode 200 is formed on the protection film 107.

Although not shown, the pixel electrode 200 may be coupled to the light-emitting control drain electrode 166d through a via hole formed in the protection film 107. A pixel-defining film (not shown) may be formed on the edge of the pixel electrode 200 and the protection film 107 and may have a pixel opening (not shown) to expose the pixel electrode 200. The pixel-defining film may be formed of an organic material, such as a polyacrylate resin or polyimides, or a silica series inorganic material. An organic light-emitting layer (not shown) may be formed on the pixel electrode 200 exposed through the pixel opening, and a common electrode (not shown) may be formed on the organic light-emitting layer. As such, an OLED, including the pixel electrode 200, the organic light-emitting layer, and the common electrode, may be formed.

In one embodiment, the pixel electrode 200 is an anode that is a hole injection electrode, and the common electrode is a cathode that is an electron injection electrode. However, the present invention is not necessarily limited thereto, and according to a driving method of the OLED display, the pixel electrode 200 may be cathode, and the common electrode may be an anode. Light is emitted when holes and electrons are injected from the pixel electrode 200 and the common electrode, respectively, and excitons generated by combining the injected holes and electrons to transition from an excited state to a ground state.

The organic light-emitting layer may be formed of a low-molecular weight organic material or a high-molecular weight organic material, such as Poly 3,4-ethylenedioxy-thiophene (PEDOT). In addition, the organic light-emitting layer may be formed of a multi-film structure including at least one of a hole injection layer (HIL), a hole transporting layer (HTL), an electron transporting layer (ETL), and an electron injection layer (EIL). In one embodiment, when the multi-film structure includes all of the HIL, the HTL, the ETL, and the EIL, the HIL is arranged on the pixel electrode 200 that is the anode, and then the HTL, the ETL, and the EIL are sequentially layered on the HIL. When the common electrode is formed of a reflection-type conductive material, the OLED display may be a rear-surface light-emitting type display. Examples of the reflection-type conductive material include lithium (Li), calcium (Ca), lithium fluoride/calcium (LiF/Ca), lithium fluoride/aluminum (LiF/Al), Al, silver (Ag), magnesium (Mg), and gold (Au).

Figure 6:
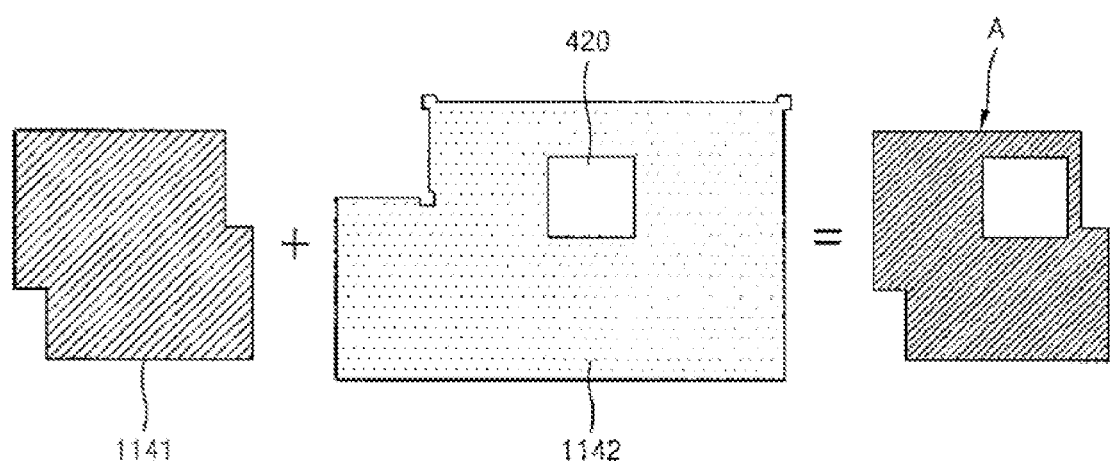
FIG. 6 is a top view schematically showing an overlapping region of a storage capacitor in the pixel of FIG. 2.

FIG. 6 is a top view schematically showing an overlapping region of the storage capacitor Cst in the OLED display of FIG. 2. FIGS. 7A to 7D are top views showing cases where an overlay deviation occurs between the lower and upper electrodes 1141 and 1142 of the storage capacitor Cst in the OLED display of FIG. 2.

Figure 7A:
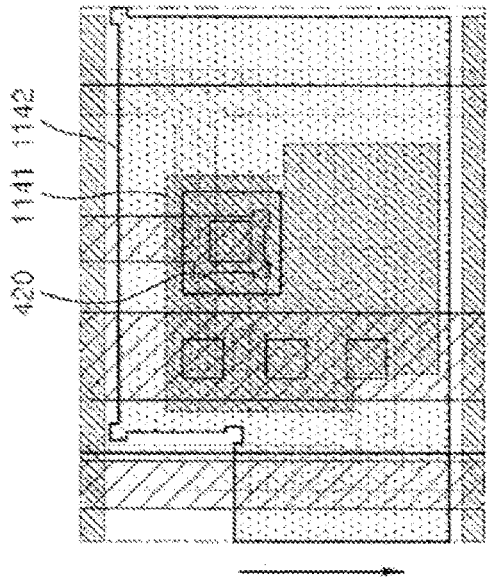
FIGS. 7A to 7D are top views showing cases where an overlay deviation occurs between both electrodes of the storage capacitor in the pixel of FIG. 2.
Figure 7B:
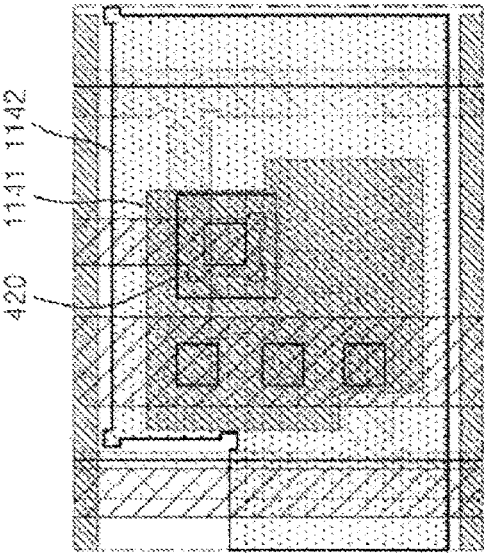
Figure 7C:
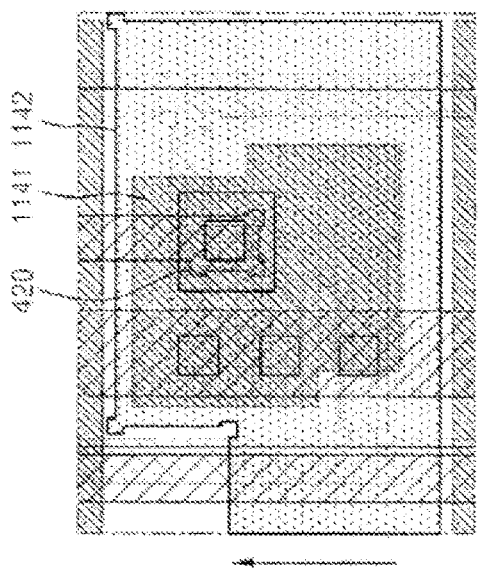
Figure 7D:
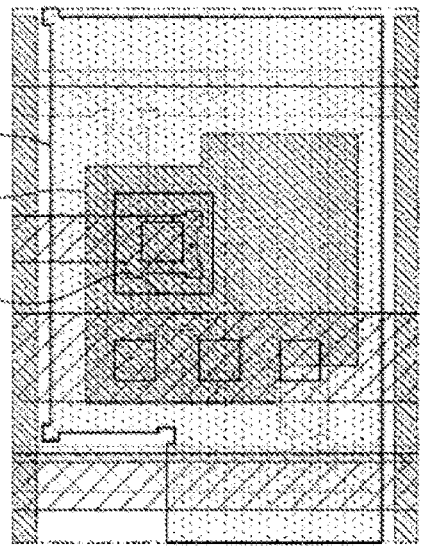

Referring to FIGS. 6 to 7D, the OLED display is characterized in that a capacitance of the storage capacitor Cst may be maintained (e.g., always maintained) to be substantially constant even though an overlay deviation occurs between the lower and upper electrodes 1141 and 1142 during a manufacturing process of the OLED display. The storage capacitor Cst includes the upper electrode 1142, which overlaps with the whole lower electrode 1141 and has the storage opening 420 in a simple closed curve shape.

When the two or more layers overlapping each other are formed, if each of the two or more layers overlapping each other is shifted to the top, bottom, left, or right, an overlapping region due to the shift differs from an initially designed overlapping region, and this overlapping region difference is the overlay deviation. The overlay deviation may occur due to a misalignment between a substrate and a mask or a light exposure device when a conductive layer is formed on the whole substrate and is patterned by a photolithography process. This overlay deviation may have a high probability of occurring within a tolerance (or tolerance level) of process equipment in a system for concurrently (e.g., simultaneously) producing a great number of large panels.

Referring to FIG. 6, a capacitance between the lower and upper electrodes 1141 and 1142 of the storage capacitor Cst is determined by Equation 1. In Equation 1, C denotes a capacitance, c denotes a dielectric constant, A denotes an area of an overlapping region of the lower and upper electrodes 1141 and 1142, and d denotes a distance between the lower and upper electrodes 1141 and 1142.

$$C = \varepsilon \frac{A}{d} \quad (1)$$

That is, the capacitance of the storage capacitor Cst may be determined by a dielectric constant c of the second gate insulation layer 1032, the distance d between the lower and upper electrodes 1141 and 1142, and the area A of the overlapping region of the lower and upper electrodes 1141 and 1142. Thus, when the area A of the overlapping region of the lower and upper electrodes 1141 and 1142 varies, the capacitance also varies. In other words, when an overlay deviation between the lower and upper electrodes 1141 and 1142 occurs, the capacitance may be different from a designed value. If the capacitance is different from the designed value, problems, such as low-gradation spots and abnormal colors, may occur, thereby degrading the quality of the OLED display.

To address these problems, an OLED display according to embodiments of the present invention is characterized in that the capacitance of the storage capacitor Cst may be maintained (e.g., always maintained) to be substantially constant even though an overlay deviation occurs between the lower and upper electrodes 1141 and 1142. In one embodiment, the storage capacitor Cst includes the upper electrode 1142 having the storage opening 420 in a simple closed curve shape.

For example, FIG. 7A shows a case where the lower electrode 1141 is shifted to the top (in a +Y direction) rather than a designed location. FIG. 7B shows a case where the lower electrode 1141 is shifted to the bottom (in a −Y direction) rather than the designed location, FIG. 7C shows a case where the lower electrode 1141 is shifted to the right (in a +X direction) rather than the designed location, and FIG. 7D shows a case where the lower electrode 1141 is shifted to the left (in a −X direction) rather than the designed location.

A shift (or shift level) may be generated within a tolerance (or tolerance level) of process equipment, and the tolerance may be at most within a range in which the opening 420 of the upper electrode 1142 overlaps with the lower electrode 1141. When a shift occurs to a region in which the opening 420 of the upper electrode 1142 does not overlap with the lower electrode 1141, a problem may occur in forming the connection node 36 and the first node contact hole 361, thereby making the pixel circuit inoperable. Thus, aspects of embodiments of the present invention do not deal with the case that the tolerance (or tolerance level) exceeds the range in which the opening 420 of the upper electrode 1142 overlaps with the lower electrode 1141. So that the whole lower electrode 1141 and the upper electrode 1142 overlap each other, an area of the upper electrode 1142 may be equal to or greater than that of the lower electrode 1141. For example, the area of the upper electrode 1142 may be as large as that of the lower electrode 1141 so that the capacitance may be maintained (e.g., always maintained) to be substantially constant even though a shift occurs.

According to each case of FIGS. 7A to 7D, even though the lower electrode 1141 is shifted to the top, bottom, left, and right from the designed location, the upper electrode 1142 overlaps (or always overlaps) with the whole lower electrode 1141, and the opening 420 of the upper electrode 1142 overlaps (or always overlaps) with the lower electrode 1141, and thus, the capacitance may be maintained to be substantially constant.

Although the lower electrode 1141 is shifted in FIGS. 7A to 7D, the present invention is not limited thereto, and the capacitance may be maintained to be substantially constant even though the upper electrode 1142 is shifted.

According to an embodiment of the present invention, the whole lower electrode and an upper electrode of a storage capacitor overlap each other, and an opening is formed in the upper electrode to overlap with the lower electrode, and thus even though an overlay deviation occurs between the two electrodes, a capacitance may be maintained (e.g., always maintained) to be substantially constant. Accordingly, low-gradation spots and abnormal colors due to a capacitance change may be prevented.

While the present invention has been particularly shown and described with reference to exemplary embodiments thereof, it will be understood by one of ordinary skill in the art that various changes in form and details may be made therein without departing from the spirit and scope of the present invention as defined by the following claims and their equivalents.

What is claimed is:

1. A display device comprising:
a substrate;
a first scan line disposed on the substrate, the first scan line extending in a first direction;
a data line crossing the first scan line, the data line extending in a second direction;
a driving voltage line crossing the first scan line;
an organic light emitting diode (OLED) including a first electrode, an organic light-emitting layer and a second electrode; and
a pixel circuit coupled to the organic light emitting diode, wherein the pixel circuit comprises:
a first thin film transistor including a first channel region, a third electrode coupled to the first channel region, a fourth electrode coupled to the first channel region, and a first gate electrode overlapping the first channel region in a plan view, wherein the first thin film transistor is coupled to the organic light emitting diode;
a second thin film transistor including a second channel region, a fifth electrode coupled to the second channel region, a sixth electrode coupled to the second channel region, and a second gate electrode overlapping the second channel region in the plan view, wherein the second gate electrode is coupled to the first scan line; and
a storage capacitor including the first gate electrode and a first metal pattern overlapping the first gate electrode in the plan view, the first metal pattern being coupled to the driving voltage line,
wherein all of the first channel region, the first gate electrode, and the first metal pattern are overlapped with each other in the plan view, the first metal pattern and the data line are overlapped with each other in the plan view, the first metal pattern and the driving voltage line are overlapped with each other in the plan view, and
wherein an entire area of a first portion in which the first metal pattern and the data line are overlapped with each other is smaller than an entire area of a second portion in which the first metal pattern and the driving voltage line are overlapped with each other.

2. The display device of claim 1, wherein the first metal pattern comprises an opening.

3. The display device of claim 2, wherein the pixel circuit further comprises a first connection member, the first connection member couples the first gate electrode and the fifth electrode, and an end portion of the first connection member is disposed within the opening.

4. The display device of claim 3, wherein the first connection member and the first metal pattern are overlapped with each other in the plan view.

5. The display device of claim 4, wherein the first connection member and the first electrode are overlapped with each other in the plan view, and the connection member disposed between the first metal pattern and the first electrode in a cross-sectional view.

6. The display device of claim 4, wherein the first connection member is disposed on a same layer as the data line or the driving voltage line.

7. The display device of claim 3, wherein the display device further comprises a node contact hole within the opening, and wherein at least a portion of the first connection member is coupled to the first gate electrode through the node contact hole, and the node contact hole is defined by at least one insulating layer between the first gate electrode and the first connection member.

8. The display device of claim 7, wherein a size of the opening is greater than a size of the node contact hole in the plan view.

9. The display device of claim 3, wherein the first connection member crosses the first scan line.

10. The display device of claim 3, wherein a longest length of the first portion in the second direction is smaller than a longest length of the second portion in the second direction.

11. The display device of claim 10, wherein a greatest width of the first portion in the first direction is smaller than a greatest width of the second portion in the first direction.

12. The display device of claim 3, wherein an entire area of a third portion in which the first gate electrode and the driving voltage line are overlapped with each other in the plan view is smaller than the entire area of the second portion.

13. The display device of claim 12, a greatest width of the first portion in the first direction is smaller than a greatest width of the second portion in the first direction.

14. The display device of claim 3, wherein the display device further comprises a first contact hole, the first metal pattern and the driving voltage line are coupled to each other through the first contact hole and the first contact hole is defined by at least one insulating layer between the first metal pattern and the driving voltage line.

15. The display device of claim 14, wherein the first contact hole is overlapped with the first gate electrode.

16. The display device of claim 15, wherein the first contact hole is overlapped with the first channel region.

17. The display device of claim 3, wherein the pixel circuit has a portion in which all of the first channel region, the first gate electrode, the first metal pattern and the driving voltage line are overlapped with each other.

18. The display device of claim 3, wherein the fourth electrode and the sixth electrode are integral in a body and wherein the fourth electrode is extended from the first channel region, and the sixth electrode is extended from the second channel region.

19. The display device of claim 3, wherein the display device further comprises a second scan line and an initialization voltage line, the second scan line and the initialization voltage line cross the data line.

20. The display device of claim 19, wherein the pixel circuit further comprises a third thin film transistor including a third channel region, a seventh electrode coupled to the third channel region, an eighth electrode coupled to the third channel region, and the third gate electrode overlapping the third channel region in the plan view, wherein the third gate electrode is coupled to the second scan line, wherein the eighth electrode coupled to the initialization voltage line, and the seventh electrode and the fifth electrode are integral in a body.

21. The display device of claim 20, wherein the eighth electrode coupled to the initialization voltage line via a second connection member.

22. The display device of claim 20, wherein the pixel circuit further comprises a fourth thin film transistor including a fourth channel region, a ninth electrode coupled to the fourth channel region, a tenth electrode coupled to the fourth channel region, and a fourth gate electrode overlapping the fourth channel region in the plan view, wherein the fourth gate electrode is coupled to the first scan line, the ninth electrode is coupled to the data line, and the tenth electrode is electrode is coupled to the third electrode of the first thin film transistor.

23. The display device of claim 19, wherein the pixel circuit further comprises a third thin film transistor including a third channel region, a seventh electrode coupled to the third channel region, an eighth electrode coupled to the third channel region, and a third gate electrode overlapping the third channel region in the plan view, wherein the third gate electrode is coupled to the second scan line, and the seventh electrode and the first gate electrode are coupled to each other via the first connection member.

24. The display device of claim 23, wherein the eighth electrode is coupled to the initialization voltage line via a second connection member.

25. The display device of claim 2, wherein an entire area of the opening is overlapped with the first electrode in the plan view.

26. The display device of claim 2, wherein an entire area of the opening is overlapped with the first gate electrode in the plan view.

27. The display device of claim 1, wherein a longest length of the first portion in the second direction is smaller than a longest length of the second portion in the second direction.

28. The display device of claim 27, wherein a greatest width of the first portion in the first direction is smaller than a greatest width of the second portion in the first direction.

29. The display device of claim 1, wherein an entire area of a third portion in which the first gate electrode and the driving voltage line are overlapped with each other in the plan view is smaller than the entire area of the second portion.

30. The display device of claim 29, wherein an entire area of a fourth portion in which the first channel region and the driving voltage line are overlapped with each other in the plan view is smaller than the entire area of the second portion, and a length of the first portion in the second direction is smaller than a length of the second portion in the second direction.

31. The display device of claim 1, wherein the display device further comprises a first contact hole, the first metal pattern and the driving voltage line are coupled to each other through the first contact hole, and the first contact hole is defined by at least one insulating layer between the first metal pattern and the driving voltage line.

32. The display device of claim 31, wherein the first contact hole is overlapped with the first gate electrode.

33. The display device of claim 32, wherein the first contact hole is overlapped with the first channel region.

34. The display device of claim 1, wherein the pixel circuit has a portion in which all of the first channel region, the first gate electrode, the first metal pattern and the driving voltage line are overlapped with each other.

35. The display device of claim 34, wherein a longest length of the first portion in the second direction is smaller than a longest length of the second portion in the second direction, and an entire area of a third portion in which the first gate electrode and the driving voltage line are overlapped with each other in the plan view is smaller than the entire area of the second portion.

36. The display device of claim 1, wherein the fourth electrode and the sixth electrode are integral in a body.

37. The display device of claim 35, wherein the fourth electrode is extended from the first channel region, and the sixth electrode is extended from the second channel region.

38. The display device of claim 1, wherein the display device further comprises a second scan line and an initialization voltage line, and the second scan line and the initialization voltage line cross the data line.

39. The display device of claim 38, wherein the second scan line and the initialization voltage line are overlapped with each other in the plan view.

40. The display device of claim 38, wherein the pixel circuit further comprises a third thin film transistor including a third channel region, a seventh electrode coupled to the third channel region, an eighth electrode coupled to the third channel region, and the third gate electrode overlapping the third channel region in the plan view, wherein the third gate electrode is coupled to the second scan line, the eighth electrode is coupled to the initialization voltage line, and the seventh electrode and the fifth electrode are integral in a body.

41. The display device of claim 40, wherein the eighth electrode is coupled to the initialization voltage line via a second connection member.

42. The display device of claim 38, wherein the pixel circuit further comprises a third thin film transistor including a third channel region, a seventh electrode coupled to the third channel region, an eighth electrode coupled to the third channel region, and the third gate electrode overlapping the third channel region in the plan view, wherein the second gate electrode is coupled to the second scan line, and the seventh electrode and the first gate electrode are coupled to each other via a first connection member.

43. The display device of claim 42, wherein the first connection member and the seventh electrode are coupled to each other through a second contact hole, and the second contact hole is defined by at least one insulating layer between the first connection member and the seventh electrode.

44. The display device of claim 42, wherein the eighth electrode is coupled to the initialization voltage line via a second connection member.

* * * * *